United States Patent [19]
Michel

[11] Patent Number: 5,097,158
[45] Date of Patent: Mar. 17, 1992

[54] DIGITAL NOISE FEEDTHROUGH REDUCER AND SYNCHRONIZER FOR MIXED-SIGNAL INTEGRATED CIRCUIT

[75] Inventor: Jean-Yves Michel, Santa Clara, Calif.
[73] Assignee: National Semiconductor Corporation, Santa Clara, Calif.
[21] Appl. No.: 601,982
[22] Filed: Oct. 23, 1990
[51] Int. Cl.$^5$ .................... H03K 19/003; H03K 5/00
[52] U.S. Cl. .................. 307/542; 307/443; 364/135; 364/574
[58] Field of Search ............ 307/443, 542, 572, 475; 364/130, 135, 139, 572, 574, 487; 341/122, 155

[56] References Cited
U.S. PATENT DOCUMENTS

| | | | |
|---|---|---|---|
| 4,585,958 | 4/1986 | Chung et al. | 307/443 |
| 4,857,765 | 8/1989 | Cahill et al. | 307/443 |
| 4,950,926 | 8/1990 | Isobe et al. | 307/443 |
| 4,965,474 | 10/1990 | Childers et al. | 307/542 |

OTHER PUBLICATIONS

Analog Devices, "Minimize the Effects of Digital Feedthrough", Engineering Design News, May 11, 1989, pp. 160-161.

*Primary Examiner*—John Zazworsky
*Attorney, Agent, or Firm*—Limbach & Limbach

[57] ABSTRACT

A solution to the problem of analog decision making in a "mixed-signal" integrated circuit removes pulses of the local clock from the analog decision trigger whenever chip select is active, thereby freezing the mixed-signal circuit while it is accessed.

3 Claims, 2 Drawing Sheets

DIGITAL NOISE FEEDTHROUGH REDUCER AND SYNCHRONIZER FOR MIXED-SIGNAL INTEGRATED CIRCUIT

BACKGROUND OF THE INVENTION

1. Field of the Invention

The present invention relates to semiconductor integrated circuits and, in particular, to noise reduction and synchronization in an analog/digital "mixed-signal" integrated circuit.

2. Discussion of the Prior Art

FIG. 1 shows a "mixed-signal" integrated circuit 10 that includes both a number of analog input sampling circuits 12 and digital data bus circuitry 14. Mixed-signal circuits are typically utilized in sample or control applications. Each sample circuit 12 periodically samples an analog system parameter based on a local clock CLK. That is, the local clock CLK drives a trigger 16 that provides an analog input signal received from external analog circuitry to a conversion circuit 18, e.g. a comparator/A-D convertor combination. The conversion circuit 18 generates a digital value that corresponds to the level of the analog input signal. The digital value is then stored in an internal register 20 of the integrated circuit 10. A microprocessor or microcontroller (not shown) accesses the integrated circuit 10 periodically via a digital data bus 22, asynchronously to the local clock CLK, to read the digital value from the internal register 20, or to write digital data to or read digital data from other internal registers of the integrated circuit 10.

Problems arise in the operation of a "mixed-signal" circuit when analog sampling decisions are made during the time that the control processor is accessing the circuit's digital data bus 22. Digital noise generated by the processor access to the data bus 22 can be fed through to the analog sample circuit 12, inducing a wrong decision in the low voltage analog sample. The digital feedthrough noise can result from supply noise, RF noise, ground noise and capacitive coupling between the analog and digital circuits.

The conventional approach to reducing this problem of digital feedthrough has been to delay the critical analog decision making function when the digital data bus 22 is accessed.

For example, one such solution is disclosed by Analog Devices in the May 11, 1989, issue of *Engineering Design News* (EDN), pages 160–161.

Referring to the FIG. 2 schematic and its associated FIG. 3 waveforms, according to the Analog Devices approach, the READ signal applied by the control processor to the I/O buffers of the digital data bus is utilized to enable a delay in the analog decision trigger. Thus, if, as shown in the TRIGGER 1 case, the trigger is activated by the local clock CLK during a read operation, then the critical analog decision is delayed until after the read operation has been completed.

The problem with this approach is that noise is still injected into the analog decision when the trigger occurs slightly before or slightly after the READ signal is asserted. As shown in the FIG. 3 TRIGGER 2 case, if the trigger occurs slightly before the time that the READ pulse is asserted, then the analog decision pulse is not delayed and overlaps with the high noise zone accompanying the read operation. As shown in the FIG. 3 TRIGGER 3 case, if the trigger occurs just slightly after the READ pulse goes low, then the analog decision may still be affected by residual noise from the read operation.

Thus, the conventional solution to the problem of digital noise feedthrough still allows critical analog decisions to be made during a time when the decision may be altered by digital noise caused by access to the device's digital data bus. Furthermore, this approach does not delay other chip functions; thus, collisions can occur that create metastable digital states.

SUMMARY OF THE INVENTION

The present invention provides a solution to the problem of analog decision making in "mixed-signal" integrated circuits by removing local clock pulses from the analog decision trigger whenever the chip select signal to the mixed-signal device is active, thereby freezing the circuit while it is accessed. The sampling circuit's trigger element still responds to a clock signal internal to the mixed-signal integrated circuit to periodically sample an analog input signal to provide an analog decision. However, in accordance with the present invention, clock removal means responds to a chip select signal applied to the mixed-signal device by removing the clock signal from the trigger element when the chip select signal is asserted.

In accordance with one embodiment of the invention, the clock removal means includes a NOR gate connected to provide its output to the trigger element's clock signal input and a D flip-flop that has its data input connected to receive the chip select signal, its data output connected to a first input of the NOR gate and its clock input connected to receive the clock signal. A series of inverters is connected between the clock signal and the second input of the NOR gate. Thus, the NOR gate removes the clock signal from the trigger element clock signal input when the chip select signal is asserted.

The present invention solves both problems resulting from past approaches. First, critical analog decisions are unaffected by noise resulting from access to the digital data bus. Second, the analog decisions of the device are synchronized, since none of the device's registers can be loaded during a READ access.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
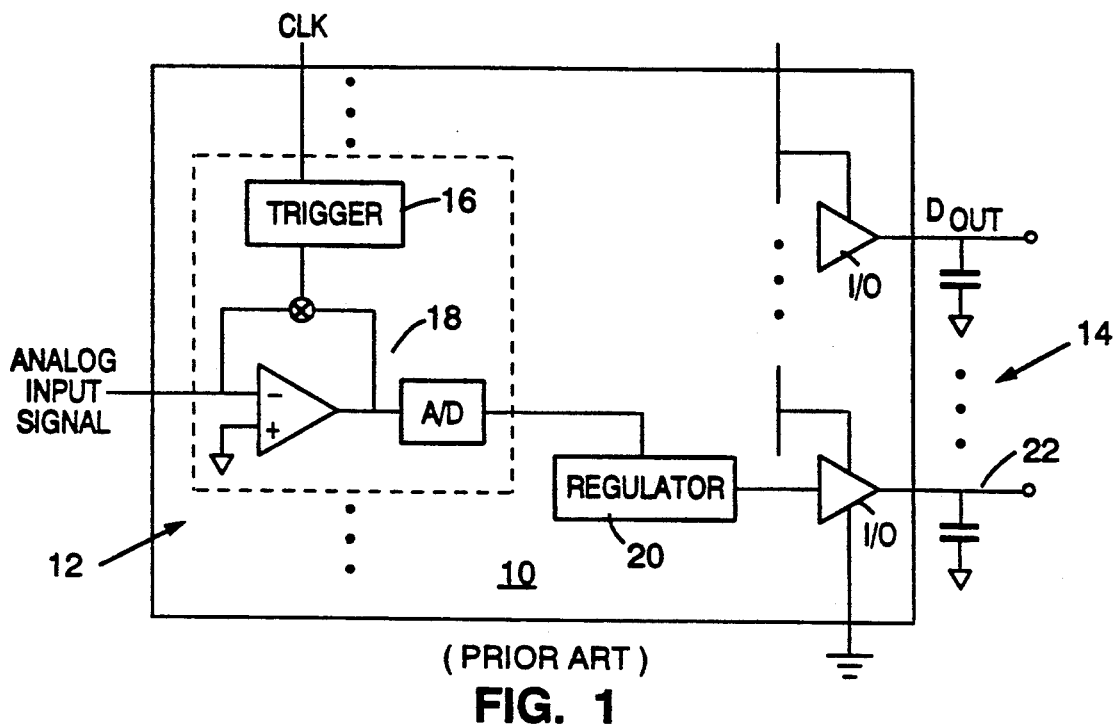
FIG. 1 is a schematic diagram illustrating a conventional "mixed-signal" integrated circuit with a microprocessor interface.
Figure 2:
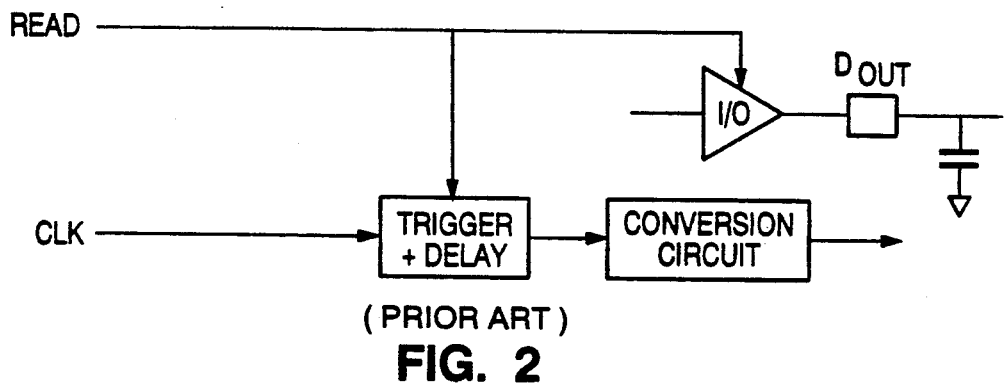
FIG. 2 is a simple schematic diagram illustrating a conventional solution to the problem of digital feedthrough in a mixed-signal integrated circuit.
Figure 3:
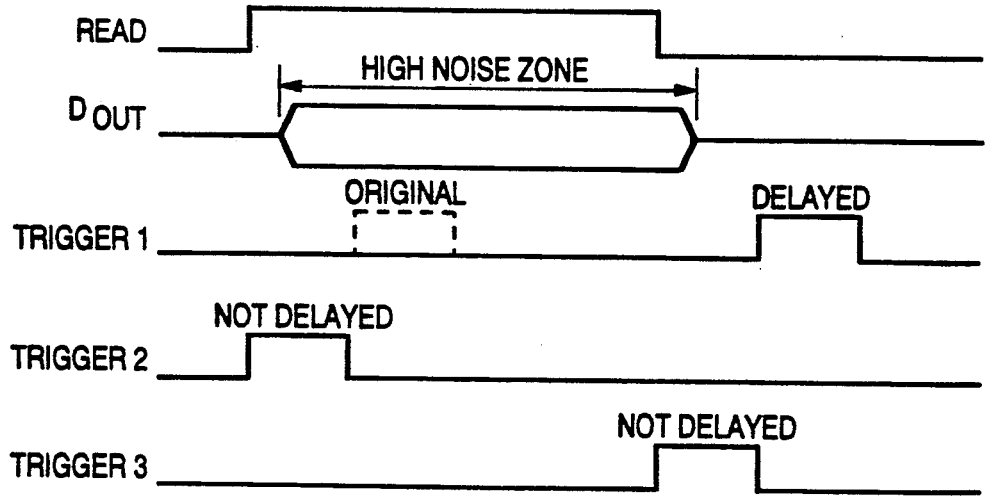
FIG. 3 provides a series of timing diagrams illustrating signal waveforms associated with the operation of the FIG. 2 circuit.
Figure 4:
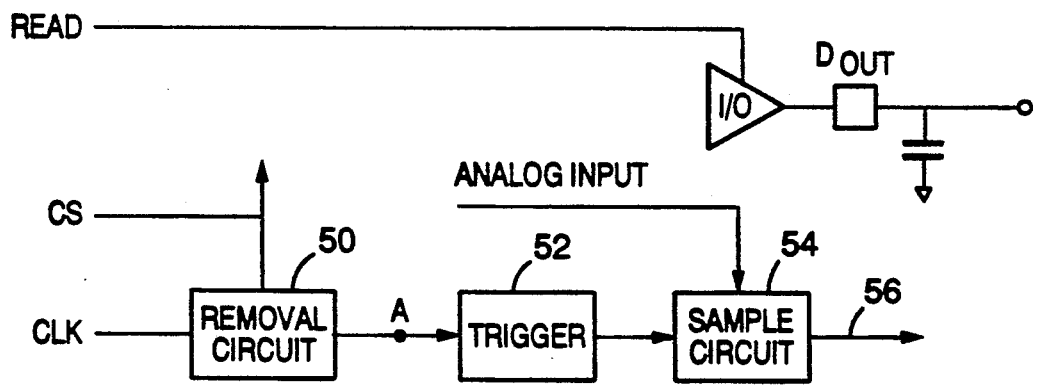
FIG. 4 is a simple schematic diagram illustrating a solution to the problem of digital feedthrough in a "mixed-signal" integrated circuit in accordance with the present invention.

FIG. 4 shows two elements of a mixed-signal integrated circuit. The upper portion of FIG. 4 shows a data-out port $D_{out}$ of a digital data bus of the mixed-signal circuit.

Figure 5:
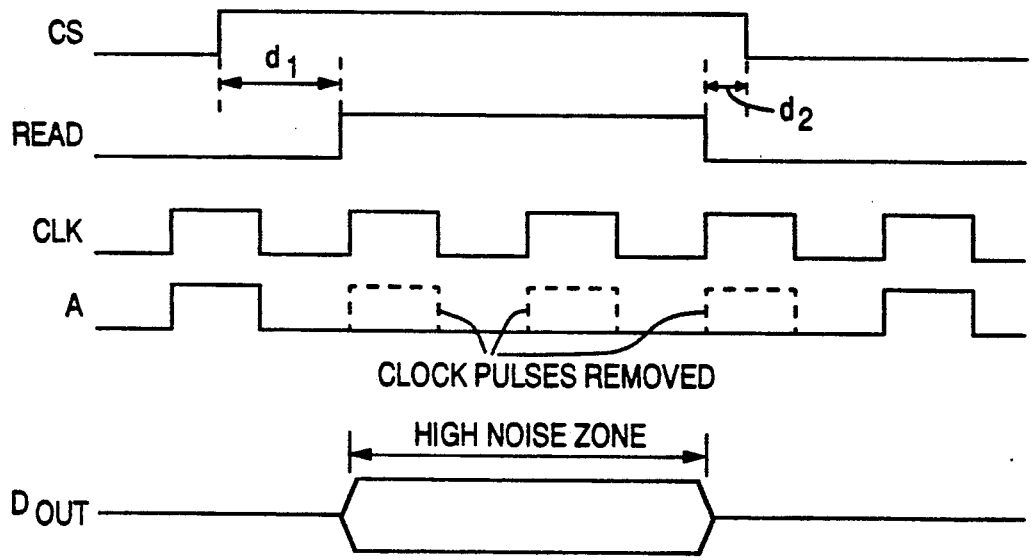
FIG. 5 provides a series of timing diagrams illustrating signal waveforms associated with the operation of the FIG. 4 circuit.

Referring to FIG. 5, in the conventional operation of the mixed-signal circuit, digital data is read from the internal registers of the circuit by first applying a chip select signal CS to the device to enable the digital data bus. After a time period $d_1$, which is defined by the specification for the mixed-signal integrated circuit, a READ signal (or a WRITE signal) is applied to the I/O buffers of the data bus to provide access to a designated internal register. As shown in FIG. 5, the chip select signal CS remains active for a specified time period dz after the READ operation has been completed. As further shown in FIG. 5, the READ operation is accompanied by a high noise zone associated with the digital data bus which may interfere with analog sampling decisions on the mixed-signal integrated circuit.

The lower portion of FIG. 4 shows analog sampling circuitry in accordance with the concepts of the present invention. A clock signal CLK is applied to clock removal circuitry 50 which passes the clock signal CLK to node A if the chip select signal CS is deasserted. The clock signal CLK at node A drives a trigger element 52 which periodically enables analog sampling circuitry 54 which samples an analog input signal. The analog sampling circuitry may be, for example, a comparator A/D-converter combination to provide an analog decision output 56 to an internal register of the integrated circuit.

In accordance with the present invention, the clock removal circuitry 50 responds to assertion of the chip select signal CS by removing the clock pulses CLK from the trigger element 52, rather than by delaying the trigger element as in the prior art solutions. Thus, no analog decision may be made during the time that the chip select CS signal is asserted.

Figure 6:
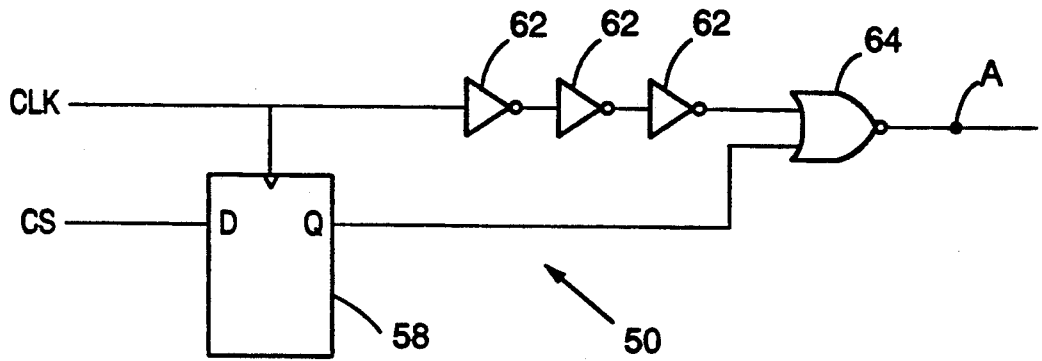
FIG. 6 is a simple schematic diagram illustrating an embodiment of clock removal circuitry utilizable in the FIG. 4 circuit.

FIG. 6 shows one of many possible implementations of the clock removal circuitry 50. The chip select signal CS is provided to the data input of D flip-flop 58. The clock signal CLK drives the data output of flip-flop 58 to NOR gate 60. The output of NOR gate 60 drives node A of the FIG. 4 circuit. The clock signal CLK is provided to NOR gate 60 via a series of three inverters 62. Thus, when the chip select signal CS is asserted, NOR gate 60 removes the clock pulses from node A, thereby disabling the trigger element 52.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. Noise reduction circuitry utilizable for reducing digital noise feedthrough in a mixed-signal circuit, the mixed-signal circuit including analog sampling circuitry that samples an analog input signal and digital circuitry that includes a digital data bus that provides an interface between the mixed-signal circuit and a control processor that allows the control processor to access the digital data bus when a chip select signal is asserted to the mixed-signal circuit, the noise reduction circuitry comprising:

(a) a trigger element responsive to pulses of a clock signal internal to the mixed-signal circuit for periodically generating a sampling signal;

(b) sampling element responsive to the sampling signal for periodically sampling the analog input signal to provide an analog output decision; and (c) clock removal means responsive to the chip select signal for removing the pulses of the clock signal from the trigger element when the chip select signal is asserted.

2. Circuitry as in claim 1 wherein the clock removal means comprises:

(a) a NOR gate connected to provide its output signal as the sampling signal to the trigger element;

(b) a D flip-flop having its data input connected to receive the chip select signal, its data output connected to a first input of the NOR gate and its clock input connected to receive the clock signal; and (c) a series of inverters having its input connected to receive the clock signal and its output connected to a second input of the NOR gate, whereby the NOR gate removes the clock signal from the trigger element when the chip select signal is asserted.

3. A method of reducing digital noise feedthrough in a mixed-signal circuit that includes analog sampling circuitry that samples an analog input signal and digital circuitry that includes a digital data bus for providing an interface to a control processor that provides control processor access to the digital data bus when a chip select signal is asserted to the mixed-signal circuit, the method comprising:

(a) sampling the analog input signal utilizing a trigger element that is responsive to pulses of a clock signal internal to the mixed-signal integrated circuit to periodically provide an analog output decision; and (b) removing the pulses of the clock signal from the trigger element when the chip select signal is asserted.

* * * * *